(12) United States Patent
Inoue

(10) Patent No.: US 6,228,737 B1
(45) Date of Patent: May 8, 2001

(54) METHOD OF MANUFACTURING SEMICONDUCTOR DEVICE

(75) Inventor: Nobuhiko Inoue, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/225,350

(22) Filed: Jan. 5, 1999

(30) Foreign Application Priority Data

Jan. 12, 1998 (JP) .................................................. 10-004279

(51) Int. Cl.$^7$ ............................................... H01L 21/8242
(52) U.S. Cl. ......................... 438/396; 438/253; 438/255; 438/398; 438/791
(58) Field of Search ................................... 438/253, 396, 438/240, 775, 791, 255, 398

(56) References Cited

U.S. PATENT DOCUMENTS 5,518,946 * 5/1996 Kuroda .................................. 438/396
5,930,106 * 7/1999 Deboer et al. ......................... 361/305

* cited by examiner

Primary Examiner—Carl Whitehead, Jr.
Assistant Examiner—Toniae M. Thomas
(74) Attorney, Agent, or Firm—Jones Volentine, LLC

(57) ABSTRACT

A plurality of CVD silicon nitride film islands are formed on a lower electrode which is located over a semiconductor substrate. The plurality of CVD silicon nitride film islands are spaced apart from one another to define exposed regions of the lower electrode therebetween. The CVD silicon nitride film islands and the exposed regions of the lower electrode are then subjected to heat treatment in a nitride atmosphere to form thermal silicon nitride films in the exposed regions of the lower electrode. A capacitor insulating film is formed over the CVD silicon nitride film islands and the thermal silicon nitride films, and then an upper electrode is formed over the capacitor insulating film.

6 Claims, 3 Drawing Sheets

METHOD OF MANUFACTURING SEMICONDUCTOR DEVICE

BACKGROUND OF THE INVENTION

1. Field of the Invention

This invention relates to a method of manufacturing a capacitor of a memory. Specifically, this invention relates to a method of forming a capacitor insulating film over a lower electrode of a capacitor.

2. Description of the Related Art

With high integration and densification of a VLSI, the dimensions of a device have been miniaturized in recent years. With their miniaturization, the capacity of a capacitor decreases as a result of a reduction in the area of the capacitor. In order to improve this, there is known a method of forming a low-layer silicon nitride film and a $Ta_2O_5$ film on doped polysilicon for a capacitor lower electrode as a capacitor insulating film.

The method of forming the nitride film and the $Ta_2O_5$ will be explained below.

An interlayer insulating film is formed over a doped silicon substrate. A lower electrode corresponding to polysilicon is formed on the interlayer insulating film. A RTN (Rapid Thermal Nitrization) process is effected on the surface of the doped polysilicon in an atmosphere of $NH_3$ at temperatures ranging from 700° C. to 1000° C. to thereby form a low-layer silicon nitride film. Subsequent to this formation, a $Ta_2O_5$ film is deposited on the low-layer nitride film by an LPCVD (Low Pressure Chemical Vapor deposition) method. Annealing is effected on the $Ta_2O_5$ film in an atmosphere of oxidation at a temperature of 600° C. or more. Thus, the $Ta_2O_5$ film is formed as a capacitor insulating film. Doped polysilicon or TiN is deposited on the capacitor insulating film by the LPCVD method and thereafter subjected to patterning. A capacitor is completed in the above-described manner.

SUMMARY OF THE INVENTION

An object of this invention is to provide a method of manufacturing a capacitor, which is capable of preventing oxidation of a lower electrode even if a low-layer nitride film is thin.

According to one aspect of this invention, for achieving the above object, there is provided a method of manufacturing a semiconductor device, comprising a step for forming CVD silicon nitride film over a lower electrode formed on a semiconductor substrate by a CVD method, a step for subjecting the semiconductor substrate to heat treatment in a nitride atmosphere subsequent to the above step to thereby form thermal silicon nitride film on the lower electrode, a step for forming a capacitor insulating film over the thermal silicon nitride film and the CVD silicon nitride film, and a step for forming an upper electrode over the capacitor insulating film.

Further, the present application discloses other various inventions made to achieve the above object. They will become apparent from the following claims, respective embodiments and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

FIGS. 2(A), 2(B), 2(C) and 2(D) are respectively diagrams showing a method of manufacturing a semiconductor device, according to one embodiment of the present invention.

Figure 2A:
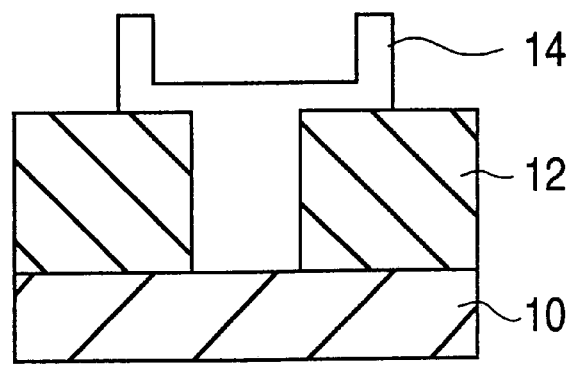
FIGS. 2(A), 2(B), 2(C) and 2(D) are respectively cross-sectional views illustrating a method of manufacturing a semiconductor device, according to an embodiment of the present invention.

As shown in FIG. 2(A), an interlayer insulating film 12 is first formed over a silicon substrate 10. A predetermined contact hole is defined in the interlayer insulating film 12. A storage node 14 used as a lower electrode is formed over the interlayer insulating film 12. The storage node 14 is joined onto the silicon substrate 10 via the contact hole. The storage node 14 has a predetermined shape with polysilicon as a material.

Figure 1A:
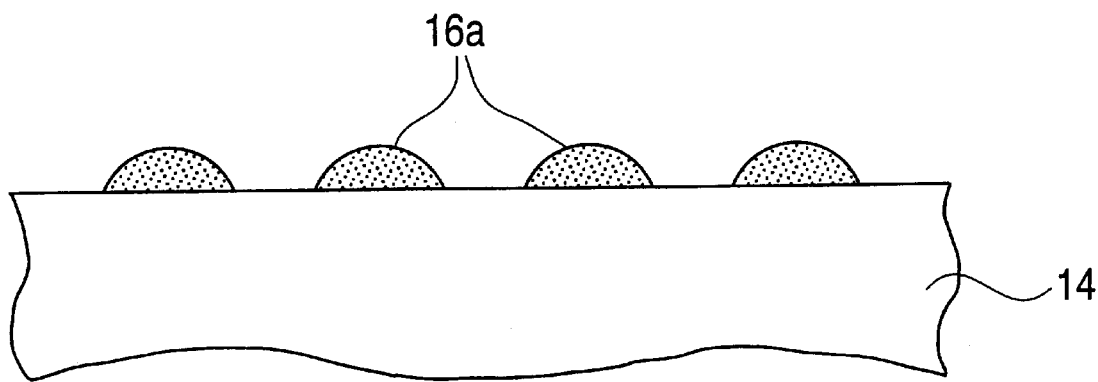
FIGS. 1(A) and 1(B) are cross-sectional views showing a method of manufacturing a silicon nitride film, according to an embodiment of the present invention.
Figure 1B:
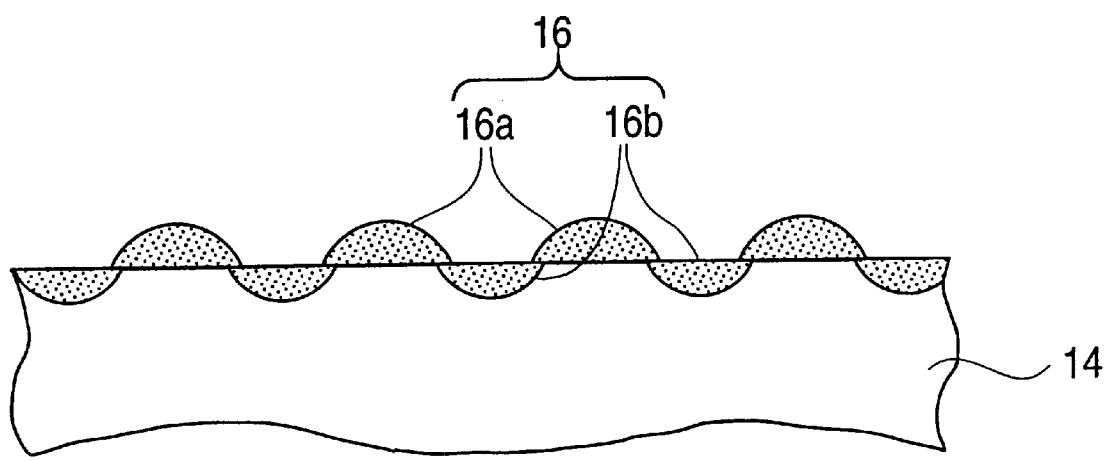
Figure 2B:
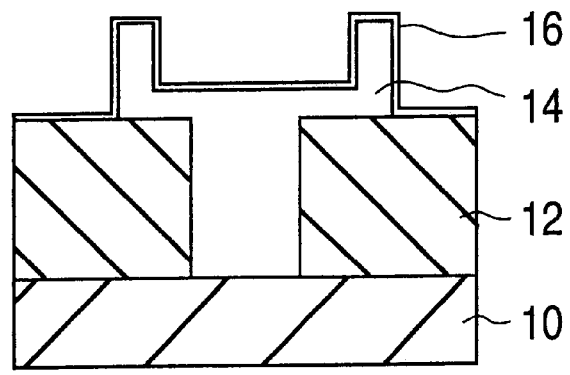

Next, as shown in FIG. 2(B), a low-layer nitride film 16 is formed over the surface of the storage node 14. The low-layer nitride film 16 is formed as a barrier layer to oxygen. As shown in FIGS. 1(A) and 1(B), this process is performed separately in the following two-staged steps.

First Step

CVD silicon nitride films 16a are formed over a storage node 14 by a CVD method. In this case, vapor deposition is performed by an LPCVD method. Dichlorosilane ($SiH_2Cl_2$) and ammonia (NH3) are used as raw gases. Further, the vapor deposition is carried out with the temperature of the silicon substrate 10 as 650° C. Thus, CVD silicon nitride films 16a ranging in thickness from 1 nm to 3 nm (having a value measured by an ellipsometer) are formed.

As shown in FIG. 1(A), each of the CVD nitride films 16a formed in this step will result in an island-structured filmy body. Namely, aggregates of a number of nitrides ($Si_3N_4$) result in a structure in which they are distributed over the surface of the lower electrode 14 in a state of being spaced away from one another.

Second Step

As shown in FIG. 1(B), the corresponding material is subjected to a RTN process at temperatures ranging from 700° C. to 1000° C. and in an atmosphere of $NH_3$ to thereby form thermal silicon nitride films 16b.

In this process, exposed portions (corresponding to portions where no nitrides are deposited) of the surface of the lower electrode 14 are subjected to the nitride atmosphere. Thus, as shown in FIG. 1(B), the thermal silicon nitride films 16b are formed in the upper surface portions of the lower electrode 14, which are not covered with the CVD nitride films 16a. As a result, the surface of the lower electrode 14 is fully covered with the silicon nitrides.

Thus, according to the manufacturing method of the present embodiment, the CVD silicon nitride films can be made extra-thin. Further, each thermal nitride film of the lower electrode 14 can be controlled to a relatively small area. It is thus possible to make an increase in capacitor's capacity.

As an alternative to the above heat treatment, the RTN process may be performed in an atmosphere of $N_2H_4$ and at temperatures ranging from 300° C. to 1000° C.

Subsequent to the forming process of the low-layer nitride film 16, a process for forming a capacitor insulating film is carried out. A $Ta_2O_5$ film is first formed on the low-layer nitride film 16 by the LPCVD method.

Figure 2C:
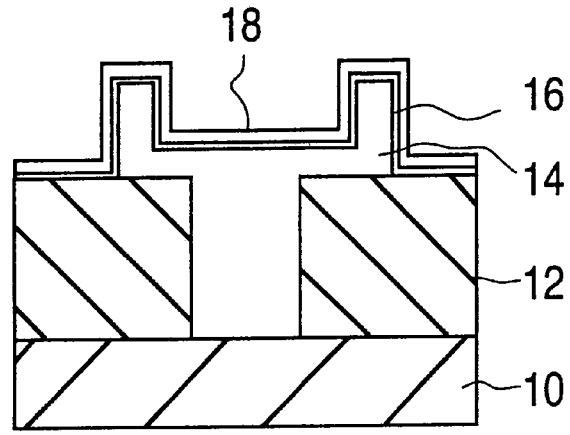

Further, the $Ta_2O_5$ film is subjected to an annealing process in an oxygen atmosphere under a temperature of 600° C. or more. Next, as shown in FIG. 2(C), a tantalum oxide ($Ta_2O_5$) film 18 is formed as the capacitor insulating film. In this process, the low-layer silicon nitride film 16 formed in the previous process serves as an oxidation stopper layer (barrier layer). Since the low-layer silicon nitride film is formed by the aforementioned method, oxygen cannot penetrate into this film. Thus, no silicon oxide film is formed on the boundary surface between the lower electrode 14 and the low-layer silicon nitride film 16.

Figure 2D:
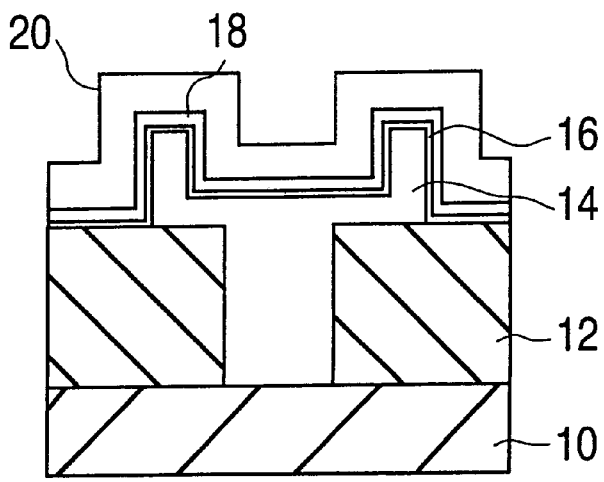

Next, an upper electrode 20 is formed over the $Ta_2O_5$ film 18 as shown in FIG. 2(D). Doped polysilicon or a TiN film deposited by the LPCVD method is used as the upper electrode. Patterning is effected thereon to form a capacitor.

Figure 3:
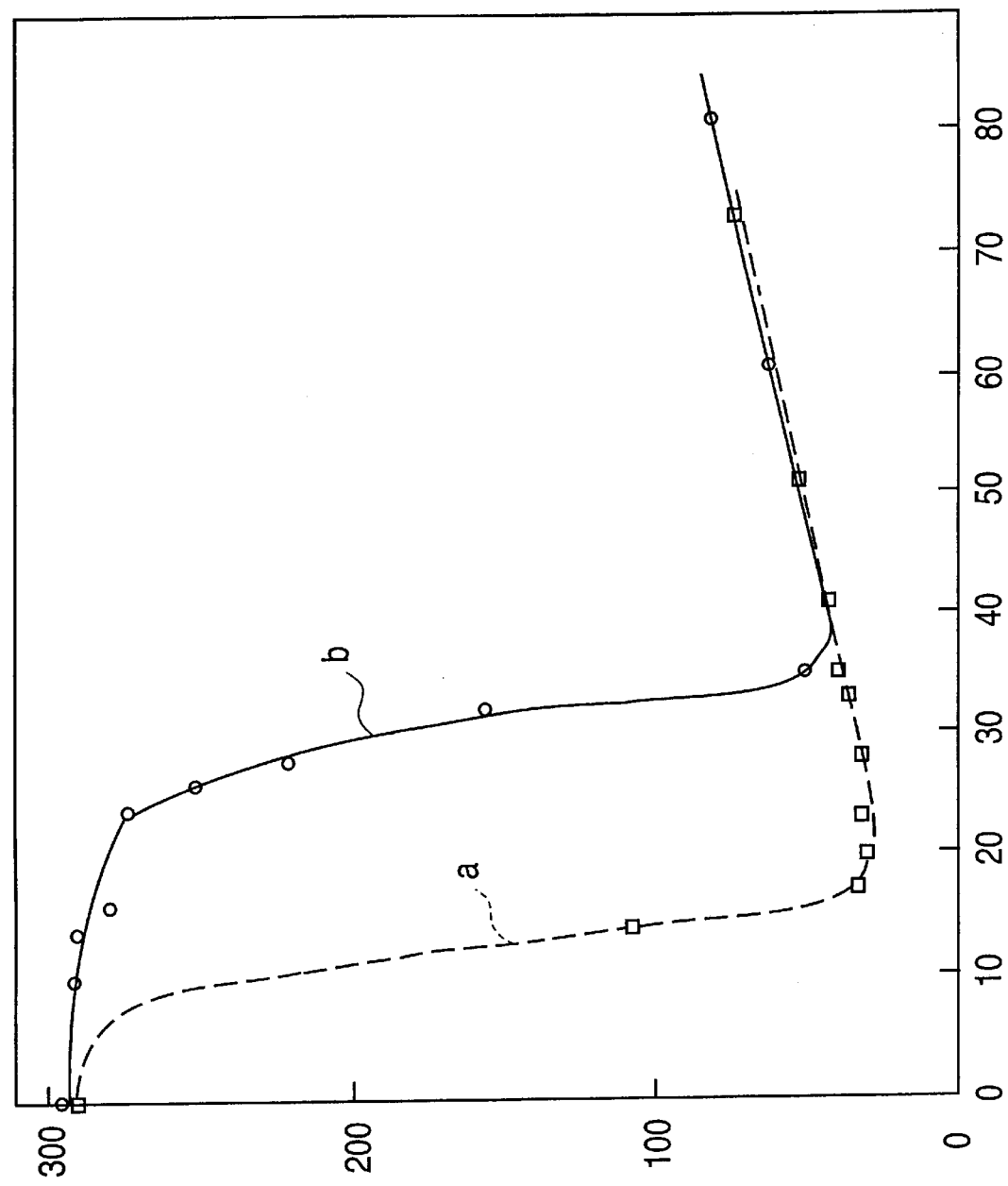
FIG. 3 is a diagram showing the resistance of an extra-thin nitride film to oxidation.

Referring next to FIG. 3, a sample in which the $Ta_2O_5$ film is formed over the low-layer silicon nitride film formed on the silicon substrate by the CVD and RTN methods is compared with a sample in which the $Ta_2O_5$ film is formed on the low-layer silicon nitride film formed over the silicon substrate by the CVD method alone.

FIG. 3 is a graph showing the resistance of the low-layer silicon nitride film to oxidation. Film-thickness values of a silicon nitride film ($Si_3N_4$ film) measured by the ellipsometer are graduated in the horizontal axis. Film-thickness values ranging from 0 Å to 80 Å are graduated every 100 Å. Film-thickness values of an oxide film (corresponding to a film unintentionally formed between a low-layer silicon nitride film and a semiconductor substrate) are graduated in the vertical axis. Film-thickness values ranging from 0 Å to 300 Å are graduated every 100 Å. Data about the silicon nitride film formed by the CVD and RTN methods are represented in the form of open square symbols in the graph. These square symbols are connected to one another by a broken line. Further, data about the low-layer silicon nitride film formed by the CVD method alone are represented by white-circle symbols. These white-circle symbols are connected to one another by a solid line b.

In the sample of the silicon nitride film formed by the CVD method alone as shown in FIG. 3, the thickness of the oxide film increases when the thickness of the nitride film reaches 35 Å or less. Namely, the resistance to oxidation begins to deteriorate. In the sample of the silicon nitride film formed by the RTN and CVD methods on the other hand, an increase in the thickness of the oxide film is not observed even when the thickness of the silicon nitride film is 16 Å. It may be thus said that the oxidation resistance is not deteriorated.

Thus, according to the present embodiment in which the silicon nitride film is formed by the CVD and RTN methods, even if the thickness of the low-layer silicon nitride film is thin, the oxidation resistance is small in deterioration in the capacitor forming process using the $Ta_2O_5$ film as the capacitor insulating film. Thus, a problem is avoided that the resistance of the low-layer silicon nitride film to oxidation breaks upon annealing in the oxygen atmosphere at the temperature of 600° C. or more so that the silicon oxide film is formed on the interface with the polysilicon for the lower electrode, whereby an effective film thickness will increase. It is also possible to realize an increase in the capacity of a capacitor.

Although the present embodiment has used the tantalum oxide film as the capacitor insulating film, another insulating film formed by annealing in the atmosphere of oxygen may be used. Further, the atmosphere and temperature or the like at heat treatment may be suitably changed according to materials.

While the present invention has been described with reference to the illustrative embodiment, this description is not intended to be construed in a limiting sense, various modifications of the illustrative embodiment will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:

forming, by chemical vapor deposition (CVD), a plurality of CVD silicon nitride film islands on a lower electrode which is located over a semiconductor substrate, the plurality of CVD silicon nitride film islands spaced apart from one another to define exposed regions of the lower electrode therebetween;

subjecting the CVD silicon nitride film islands and the exposed regions of the lower electrode to heat treatment in a nitride atmosphere to form thermal silicon nitride films in the exposed regions of the lower electrode;

forming a capacitor insulating film over the CVD silicon nitride film islands and the thermal silicon nitride films; and forming an upper electrode over the capacitor insulating film.

2. The method according to claim 1, wherein the nitride atmosphere is $NH_3$.

3. The method according to claim 2, wherein a temperature of the nitride atmosphere is 700° C. to 1000° C.

4. The method according to claim 1, wherein the nitride atmosphere is $N_2H_3$.

5. The method according to claim 4, wherein a temperature of the nitride atmosphere is 300° C. to 1000° C.

6. The method according to claim 1, wherein the capacitor insulating film is a $Ta_2O_5$ film.

* * * * *